(12) United States Patent
Zhang et al.

(10) Patent No.: US 12,100,999 B2
(45) Date of Patent: Sep. 24, 2024

(54) PERMANENT-MAGNET FAULT-TOLERANT IN-WHEEL MOTOR BASED ON ACTIVE SENSORLESS STRATEGY AND DRIVE AND DESIGN METHODS THEREOF

(71) Applicant: Jiangsu University, Jiangsu (CN)

(72) Inventors: Li Zhang, Jiangsu (CN); Sisi Deng, Jiangsu (CN); Xiaoyong Zhu, Jiangsu (CN); Zixuan Xiang, Jiangsu (CN); Dong Shen, Jiangsu (CN); Li Quan, Jiangsu (CN)

(73) Assignee: Jiangsu University, Jiangsu (CN)

( * ) Notice: Subject to any disclaimer, the term of this patent is extended or adjusted under 35 U.S.C. 154(b) by 0 days.

(21) Appl. No.: 18/031,868

(22) PCT Filed: Sep. 29, 2022

(86) PCT No.: PCT/CN2022/122525
§ 371 (c)(1),
(2) Date: Apr. 13, 2023

(87) PCT Pub. No.: WO2024/050897
PCT Pub. Date: Mar. 14, 2024

(65) Prior Publication Data
US 2024/0186852 A1    Jun. 6, 2024

(30) Foreign Application Priority Data
Sep. 5, 2022   (CN) .......................... 202211078130.8

(51) Int. Cl.
*H02K 1/279*    (2022.01)
*B60K 7/00*    (2006.01)
(Continued)

(52) U.S. Cl.
CPC ........... *H02K 1/279* (2022.01); *B60K 7/0007* (2013.01); *H02K 1/02* (2013.01); *H02K 21/22* (2013.01);
(Continued)

(58) Field of Classification Search
CPC .......... H02K 1/279; H02K 1/02; H02K 21/22; B60K 7/0007; H02P 21/13; H02P 21/22;
(Continued)

(56) References Cited

U.S. PATENT DOCUMENTS

| | | | |
|---|---|---|---|
| 10,193,430 B2* | 1/2019 | Müller | H02K 21/16 |
| 2008/0157622 A1* | 7/2008 | Shah | H02K 11/20 |
| | | | 310/180 |

(Continued)

FOREIGN PATENT DOCUMENTS

| | | |
|---|---|---|
| CN | 104201808 | 12/2014 |
| CN | 108075587 | 5/2018 |

(Continued)

OTHER PUBLICATIONS

Ying Fang, Modeling of Fault-tolerant Flux-switching Permanent-magnet Machines for Predicting Magnetic and Armature Reaction Fields, 2022, 413-421 (Year: 2022).*
(Continued)

*Primary Examiner* — Bickey Dhakal
(74) *Attorney, Agent, or Firm* — JCIPRNET

(57) ABSTRACT

The present disclosure provides a permanent-magnet fault-tolerant in-wheel motor based on an active sensorless strategy and drive and design methods thereof. The present disclosure proposes the permanent-magnet fault-tolerant in-wheel motor drive system based on an active sensorless strategy by considering sensorless operation performance in advance in a motor design stage. The present disclosure adopts fractional-slot concentrated windings, and inge-
(Continued)

niously arranges alternating poles, a multi-layer magnetic barrier, and auxiliary permanent magnets, thus improving a sensorless operation accuracy of the motor while ensuring fault tolerance of the motor. The present disclosure proposes a frequency-band-adaptive secondary harmonic suppression strategy at a control layer to suppress an influence of a secondary salient harmonic on position observation and improve dynamic response performance of a system.

9 Claims, 8 Drawing Sheets

(51) Int. Cl.
  *H02K 1/02* (2006.01)
  *H02K 21/22* (2006.01)
  *H02P 21/13* (2006.01)
  *H02P 21/22* (2016.01)
  *H03H 21/00* (2006.01)

(52) U.S. Cl.
  CPC .............. *H02P 21/13* (2013.01); *H02P 21/22* (2016.02); *H03H 21/0043* (2013.01); *H02P 2207/05* (2013.01); *H03H 2021/005* (2013.01)

(58) Field of Classification Search
  CPC ............ H02P 2207/05; H03H 21/0043; H03H 2021/005
  See application file for complete search history.

(56) References Cited

U.S. PATENT DOCUMENTS

| | | | | |
|---|---|---|---|---|
| 2013/0127280 | A1* | 5/2013 | Sugimoto | H02K 1/02 310/156.01 |
| 2022/0271591 | A1* | 8/2022 | Hassanpour | H02K 3/12 |

FOREIGN PATENT DOCUMENTS

| | | |
|---|---|---|
| CN | 114189181 | 3/2022 |
| CN | 114337019 | 4/2022 |
| JP | 2022041331 | 3/2022 |

OTHER PUBLICATIONS

"International Search Report (Form PCT/ISA/210) of PCT/CN2022/122525," mailed on Dec. 23, 2022, pp. 1-4.

"Written Opinion of the International Searching Authority (Form PCT/ISA/237) of PCT/CN2022/122525," mailed on Dec. 23, 2022, pp. 1-3.

* cited by examiner

PERMANENT-MAGNET FAULT-TOLERANT IN-WHEEL MOTOR BASED ON ACTIVE SENSORLESS STRATEGY AND DRIVE AND DESIGN METHODS THEREOF

CROSS-REFERENCE TO RELATED APPLICATION

This application is a 371 of international application of PCT application serial no. PCT/CN2022/122525, filed on Sep. 29, 2022, which claims the priority benefit of China application no. 2022110781308, filed on Sep. 05, 2022. The entirety of each of the above mentioned patent applications is hereby incorporated by reference herein and made a part of this specification.

TECHNICAL FIELD

The present disclosure relates to the technical field of a motor and its intelligent control, and in particular to a permanent-magnet fault-tolerant in-wheel motor based on an active sensorless strategy and drive and design methods thereof.

BACKGROUND

As climate change is one of the most serious challenges facing the world today, it is urgent to control the greenhouse gas emissions dominated by carbon dioxide. New energy vehicles (NEVs) have become an important means of energy conservation and emission reduction due to their low pollution level. The permanent-magnet in-wheel motor has been widely concerned in the field of NEVs due to its high output torque, high efficiency, and small size, etc.

The new generation of NEVs put forward higher requirements for the safety and reliability of the motor drive system. The permanent-magnet fault-tolerant in-wheel motor can overcome the power-switch fault, open-circuit fault, and short-circuit fault, and has great fault tolerance and high reliability. Chinese patent application CN112510862A discloses an electrically, thermally and magnetically isolated multi-phase fault-tolerant motor, which relies on multi-phase concentrated windings and a new stator structure to realize highly fault-tolerant operation of the motor under a fault condition. However, due to the concentrated windings, the fault-tolerant motor often has a low saliency ratio and a narrow speed range, thus leading to poor sensorless operation performance, failing to meet the requirements of the electric vehicle. To overcome the problem of low saliency ratio, Chinese patent application CN111654124B discloses a design method for a five-phase permanent-magnet fault-tolerant motor with a high reluctance torque and high saliency ratio. It proposes an improved slot-pole combination for the five-phase permanent-magnet fault-tolerant motor, which ensures superior fault tolerance under the premise of the high reluctance torque and high saliency ratio. This design is of great significance for achieving great fault tolerance and steady-state sensorless operation performance of the motor. However, the permanent-magnet fault-tolerant motor has a saliency ratio greater than 1, resulting in a high risk of irreversible demagnetization of the permanent magnet in the case of high-speed flux weakening. Moreover, the saliency of the motor is easy to disappear with the change of load, which worsens the dynamic sensorless operation performance of the motor. For this reason, Document "*Design and analysis of new five phase flux-intensifying fault-tolerant interior-permanent-magnet motor for sensorless operation*" (IEEE Transactions on Industrial Electronics, 2020) offers an attempt to improve the sensorless operation capability of the flux-intensifying permanent-magnet motor. However, the negative saliency ratio of the motor is not obvious, the secondary saliency problem is not overcome, and the estimation accuracy of the rotor position in a dynamic steady-state still needs to be further improved. Therefore, it is particularly important to improve the sensorless operation capability, anti-demagnetization ability, and speed range of the in-wheel motor while ensuring the basic electromagnetic performance of the motor. This can help meet the requirements of the new generation of NEVs for desired sensorless operation performance of the motor under variable operating conditions.

SUMMARY

Objective: In view of the problems in the prior art, an objective of the present disclosure is to propose a permanent-magnet fault-tolerant in-wheel motor based on an active sensorless strategy and drive and design methods thereof. The present disclosure considers the sensorless operation capability in advance in a design stage, and comprehensively considers the influence of motor parameters on the sensorless operation performance of the motor. Thus, the present disclosure meets the requirements of variable operating conditions of an electric vehicle, such as frequent start and stop, acceleration and deceleration, heavy-load climbing, high-speed cruise, and fault operation. On the basis of strong fault-tolerance and wide speed range, the present disclosure improves the sensorless operation capability of the motor, further widens a wide-range high-efficient zone of a motor drive system of the electric vehicle, and improves the safe and reliable operation performance of the motor.

Technical solutions: In order to achieve the objective of the present disclosure, the present disclosure adopts the following technical solution. A permanent-magnet fault-tolerant in-wheel motor drive system based on an active sensorless strategy includes: a five-phase permanent-magnet fault-tolerant in-wheel motor (1), a Park transform module (2), a sensorless control module (3), a maximum torque per ampere (MTPA) control module (4), a proportional integral (PI) controller (5), an inverse-Park transform module (6), a space vector pulse width modulation (SVPWM) module (7), and an inverter module (8). A drive method of the permanent-magnet fault-tolerant in-wheel motor based on the active sensorless strategy specifically includes the following steps:

step 1): designing the permanent-magnet fault-tolerant in-wheel motor based on the active sensorless strategy, where sensorless operation performance is comprehensively considered in a design stage, to obtain desired sensorless operation performance and fault tolerance;

step 2): in order to give full play to the superior sensorless operation performance of the permanent-magnet fault-tolerant in-wheel motor in the step 1), proposing a frequency-band-adaptive secondary harmonic suppression and position error signal extraction algorithm, to suppress an influence of a secondary salient harmonic on position observation, and improve dynamic response performance of sensorless control; and step 3): constructing a sensorless drive control system for a five-phase permanent-magnet fault-tolerant in-wheel motor according to the new permanent-magnet fault-tolerant in-wheel motor based on the active sensorless strategy in the step 1) and a sensorless control method in the step 2).

Further, in the step 1), the permanent-magnet fault-tolerant in-wheel motor based on the active sensorless strategy includes a rotating shaft (11), a stator (9), and a rotor (10) that are arranged in order from inside to outside; the stator (9) is composed of a stator yoke (22), armature teeth (14), stator slots (21), and fault-tolerant teeth (13); the armature teeth (14) and the fault-tolerant teeth (13) are evenly spaced along an outer circumference of the stator (9); the armature teeth (14) are wound with armature windings (12), respectively; two adjacent ones of the armature teeth (14) are isolated by one of the fault-tolerant teeth (13); main permanent magnets (15) and core poles (16) are evenly spaced along an inner circumference of the rotor (10); the main permanent magnets (15) are surface-embedded arc permanent magnets, and each of surface-embedded permanent magnet poles forms a pair of magnetic poles with adjacent one of the core poles (16); a q-axis magnetic barrier (17) close to an air gap side is formed between one of the surface-embedded permanent magnet poles and one of the core poles (16), and the q-axis magnetic barrier (17) forms an uneven air gap with the outer circumference of the stator (9); a multi-layer arc magnetic barrier (19) close to an outer circumference side is formed between one of the surface-embedded permanent magnet poles and one of the core poles (16), and a magnetic bridge (20) is formed between layers of the multi-layer arc magnetic barrier; a rectangular auxiliary permanent magnet (18) is provided between the q-axis magnetic barrier (17) and the arc magnetic barrier close to the air gap; and the auxiliary permanent magnet (18) is connected in series with one of the main permanent magnets (15).

The stator (9) and the rotor (10) each are formed by laminating a magnetically conductive material such as a silicon steel sheet, with a lamination factor of 0.96; and the armature windings (12) are made of an enameled copper conductor material.

The armature windings (12) are single-layer concentrated windings.

A number of stator teeth is a multiple of 2m, and a difference between the number of the stator teeth and a number of rotor poles is 2, m denoting a phase number of the motor.

A sum of a number of the permanent magnet poles and a number of the core poles (16) is $P_s$.

The number of the rotor poles is $P_s$, a number of the main permanent magnet (15) poles is $P_m$, a number of auxiliary permanent magnet (18) poles is $P_a$, and the number of the core poles (16) is $P_f$, where $P_m + P_f = P_s = P_a$.

The multi-layer arc magnetic barriers (19) are each located between one of the main permanent magnet (15) poles and one of the core poles (16) and are evenly distributed along a circumference of the rotor (10); and the auxiliary permanent magnets (18) are each located between one of the multi-layer arc magnetic barriers (19) and one of the q-axis magnetic barriers (17) and are evenly distributed along an outer circumference of the rotor (10).

The q-axis magnetic barriers (17) each are centered on a point of $O_1$ and have a radius of $R_1$; and the multi-layer arc magnetic barriers (19) each are centered on a point of $O_2$, and have radii of $R_2$ and $R_3$ and a thickness of $H_0$.

The main permanent magnets (15) and the auxiliary permanent magnets (18) are both made of neodymium-iron-boron permanent magnet steel; magnetizing directions of the main permanent magnets (15) each point to a center of a circle, and magnetizing directions of the auxiliary permanent magnets (18) are each along a circumference of the circle; and the magnetizing directions of two adjacent ones of the auxiliary permanent magnets (18) are opposite, such that an auxiliary magnetic field and a main magnetic field form a magnetic circuit in series.

In the present disclosure, a specific design method of the permanent-magnet fault-tolerant in-wheel motor based on the active sensorless strategy includes:

step 1.1): initially determining, by a slot-pole combination design method of a traditional fault-tolerant motor, a number of teeth of the stator (9) and a number of pole pairs of the rotor (10); and determining slot vectoring based on a principle of a maximum fundamental resultant vector;

step 1.2): arranging the alternating surface-embedded main permanent magnet poles, where the main permanent magnet poles have magnetizing directions pointing to the air gap and form a closed magnetic circuit with the core poles, to improve utilization of the permanent magnets;

step 1.3): providing the q-axis magnetic barriers (17) and the multi-layer arc magnetic barriers (19) between the main permanent magnet poles and the core poles (16) to increase a quadrature-axis reluctance, to realize a negative saliency of the motor;

step 1.4): providing the rectangular auxiliary permanent magnets (18) with circumferential magnetizing directions between the q-axis magnetic barriers (17) and the multi-layer arc magnetic barriers (19) to increase the quadrature-axis reluctance while providing an auxiliary magnetic field, to reduce a quadrature-axis inductance and further increase a negative saliency effect of the motor; and step 1.5): optimizing parameters of the main permanent magnets (15), the auxiliary permanent magnets (18), the q-axis magnetic barriers (17), and the multi-layer arc magnetic barriers (19), to obtain a desired negative saliency; and considering sensorless operation performance in advance in a motor design stage, to complete the design of the permanent-magnet fault-tolerant in-wheel motor with active sensorless operation.

The design of the permanent-magnet fault-tolerant in-wheel motor with the active sensorless operation effectively improves the sensorless operation capability of the motor, but there is still a secondary saliency problem, and the high-precision sensorless operation performance of the motor drive system is not given full play. In order to fully realize the superior sensorless operation performance of the permanent-magnet fault-tolerant in-wheel motor, the present disclosure further provides a sensorless control algorithm based on frequency-band-adaptive secondary harmonic suppression and signal extraction.

Further, in the step 2), a specific implementation of the sensorless control algorithm based on the frequency-band-adaptive secondary harmonic suppression and signal extraction includes:

2.1) suppressing the influence of the secondary salient harmonic on position observation through the frequency-band-adaptive secondary harmonic suppression algorithm:

adjusting, by an adaptive linear neuron filter based on a recursive least squares (RLS) algorithm, a filter coefficient through the adaptive algorithm to suppress a specific sub-harmonic in a position error signal; processing a harmonic reference signal r(n) and an adjustable weight component x(k) to obtain a desired output signal y(n) of the filter; and subtracting the desired output signal y(n) of the filter from an input signal U(n) to obtain a desired fundamental signal Y(n), where calculations by the RLS algorithm are as follows:

$$\begin{cases} y_1(n) = x_{11}(n-1)r_{11}(n) + x_{21}(n-1)r_{21}(n) \\ Y(n) = U(n) - y_1(n) \end{cases}$$

where, $y_1(11)$ denotes a harmonic estimator; $x_{11}(n-1)$ and $x_{21}(n-1)$ each denote an estimated amplitude of a harmonic component; $r_{11}(n)=\sin(2\hat{\theta}_e)$ and $r_{21}(n)=\cos(2\hat{\theta}_e)$ each denote a harmonic reference signal; $\hat{\theta}_e$ denotes an estimated rotor position; Y(n) denotes a filtered output; U(n) denotes a filtered input; and adjustable filter coefficients $x_{11}(n)$ and $x_{21}(n)$ are updated online based on the harmonic reference signal, and are expressed as follows:

$$\begin{cases} x_{11}(n) = x_{11}(n-1) + k_{11}(n)Y(n) \\ x_{21}(n) = x_{21}(n-1) + k_{21}(n)Y(n) \end{cases}$$

where, gain coefficients $k_{11}(n)$ and $k_{21}(n)$ are expressed as follows:

$$\begin{cases} k_{11}(n) = \dfrac{H_{11}(n-1)r_{11}(n)}{\mu + H_{11}(n-1)r_{11}^2(n)} \\ k_{21}(n) = \dfrac{H_{21}(n-1)r_{21}(n)}{\mu + H_{21}(n-1)r_{21}^2(n)} \end{cases}$$

where, $\mu$ denotes a forgetting factor, $0<\mu<1$; an inverse of an autocorrelation matrix $H_1(n)$ is converted into two scales, namely $H_{11}(n)$ and $H_{21}(n)$, to realize a simple and fast implementation of the RLS algorithm; and the $H_{11}(n)$ and $H_{21}(n)$ are expressed as follows:

$$\begin{cases} H_{11}(n) = \dfrac{H_{11}(n-1) - k_{11}(n)H_{11}(n-1)r_{11}(n)}{\mu} \\ H_{21}(n) = \dfrac{H_{21}(n-1) - k_{21}(n)H_{21}(n-1)r_{21}(n)}{\mu} \end{cases};$$

and 2.2) on a basis of the step 2.1), in combination with the frequency-band-adaptive position error signal extraction algorithm, improving dynamic response performance of sensorless control of the five-phase permanent-magnet fault-tolerant in-wheel motor, comprising:

performing linear operation, based on a characteristic that an all-pass network filter only changes a signal phase, on signals before and after filtering, to construct an adaptive band-pass filter and an adaptive band-notch filter, where a transfer function of a typical second-order all-pass network filter is:

$$A(z) = \frac{d - p(1+d)z^{-1} + z^{-2}}{1 - p(1+d)z^{-1} + dz^{-2}}$$

where, d denotes a correlation coefficient of a filter bandwidth and $$d = \frac{1 - \tan(\omega_m T_s/2)}{1 + \tan(\omega_m T_s/2)};$$

$\omega_m$ denotes the filter bandwidth with a 3 dB attenuation; $T_s$ denotes a digital sampling period; p denotes a correlation coefficient of a filtering frequency and $p=\cos(\omega_n T_s)$; $\omega_n$ denotes a resonance frequency point; and a resonance frequency in the adaptive band filter is set as:

$$\omega_n = \omega_c + \hat{\omega}_r$$

where, $\omega_c$ denotes a frequency of an injected high-frequency signal; $\hat{\omega}_r$ denotes an estimated motor speed; the resonance frequency is automatically adjusted with a motor speed to reduce a phase delay caused by the filter; and the filter bandwidth is set as:

$$\omega_m = \omega_b + \lambda|\omega^* - \hat{\omega}_r|$$

where, $\omega_b$ denotes an adjustable bandwidth; $\lambda$ denotes a dynamic adjustment factor; $\omega^*$ denotes a given speed; when the motor runs stably, the dynamic adjustment factor does not work, and the filter bandwidth depends on $\omega_b$; when the motor runs at a variable speed, the dynamic adjustment factor works, and the filter bandwidth is adjusted adaptively according to an error between an actual speed and the given speed to improve the dynamic response performance of the sensorless control; and a modulated current is expressed as:

$$\hat{i}_{q1}^* = \hat{i}_{q1h}^* \sin(\omega_h t) = f_k(\hat{\theta}_e) + HF(2\omega_h t)$$

where, $\hat{e}_{q1h}$ denotes a $q_1$-axis high-frequency response current; $HF(2\omega_h t) = \hat{I}_{q1h}\cos(2\omega_h t)$; $\omega_h$ denotes an angular frequency of the injected high-frequency signal; $\hat{I}_{q1h}$ denotes an amplitude of a $2^{nd}$-order high-frequency injected harmonic; $f_k(\hat{\theta}_e)$ denotes a position error function; $\hat{\theta}_e$ denotes an estimated angular position error; and the modulated current includes the $2^{nd}$-order high-frequency injected harmonic, so $\omega_c$ in the adaptive band-notch filter is set as $2\omega_h$, to obtain the position error signal $f_k(\hat{\theta}_e)$.

Further, in the step 3), in the five-phase permanent-magnet fault-tolerant in-wheel motor drive system based on the active sensorless strategy:

the five-phase permanent-magnet fault-tolerant in-wheel motor (1) is configured as a system drive motor module to output an electromagnetic torque $T_e$ and five-phase currents $i_{abcde}$;

the Park transform module (2) is configured to obtain feedback quadrature- and direct-axis current signals $i_{d1q1d3q3}$ based on the five-phase currents $i_{abcde}$;

the sensorless control module (3) is based on the frequency-band-adaptive secondary harmonic suppression and position error signal extraction algorithm, and is configured to estimate a rotor position $\hat{\theta}_e$ and a speed $\hat{n}_e$ based on the feedback current signal $i_{q1}$;

the MTPA control module (4) is based on an equation method, and is configured to optimally distribute a difference between the given speed n and an estimated speed $\hat{n}_e$ through a given torque output by the PI controller (5) to obtain optimal given quadrature- and direct-axis currents $i_{d1q1}^*$;

the PI controller (5) is configured to adjust a deviation between given currents $i_{d1q1d3q3}^*$ and feedback currents $i_{d1q1d3q3}$ to obtain given quadrature- and direct-axis voltage signals $U_{d1q1d3q3}$;

the inverse-Park transform module (6) is configured to inversely transform the given quadrature- and direct-axis voltage signals $U_{d1q1d3q3}$ $U_{\alpha1\beta1\alpha3\beta3}$ to obtain voltage signalsin a static coordinate system;

the SVPWM module (7) is configured to modulate the voltage signals $U_{\alpha1\beta1\alpha3\beta3}$ in a given two-phase static coordinate system into a ten-channel PWM signal required for driving the motor; and the inverter module (8) is configured to output a five-phase voltage signal through the ten-channel PWM signal to provide power to the five-phase permanent-magnet fault-tolerant in-wheel motor (1).

The present disclosure has the following beneficial effects.

(1) The present disclosure comprehensively considers the sensorless operation performance of the motor drive system from the perspective of motor design and control for the first time, and thus proposes a permanent-magnet fault-tolerant in-wheel motor drive system based on an active sensorless strategy. The present disclosure considers the sensorless operation performance in advance in the motor design stage, and thus proposes a permanent-magnet fault-tolerant in-wheel motor based on the active sensorless strategy. The present disclosure improves the rotor estimation accuracy of the motor with sensorless control in a dynamic steady state, and simplifies the complexity of the motor control algorithm. Meanwhile, the present disclosure proposes a corresponding sensorless control algorithm for the permanent-magnet fault-tolerant in-wheel motor to achieve high-precision detection of the rotor position, to cope with complex and variable operating conditions.

(2) The present disclosure improves fault tolerance of the motor through phase redundancy, and adopts fractional-slot concentrated windings to realize magnetic isolation between different phases of the motor through the fault-tolerant teeth. This design reduces magnetic circuit coupling between different phases, and greatly improves the reliability of the motor. Different from a traditional motor design, the present disclosure considers the requirement of the sensorless control layer for high-precision detection of the rotor position, and ingeniously arranges the alternating poles, the multi-layer magnetic barrier, and the q-axis magnetic barrier on the rotor. The present disclosure achieves desired negative saliency while reducing the number of the permanent magnets, and creatively improves the sensorless operation accuracy of the motor from the perspective of design.

(3) In order to further improve the torque output capacity and the negative saliency ratio, the present disclosure ingeniously and reasonably adds the auxiliary permanent magnets on the rotor of the motor. The auxiliary permanent magnets are located on a q-axis magnetic circuit, and have their magnetizing directions along the circumference. The auxiliary permanent magnets and the main permanent magnets are connected in series on the magnetic circuit to improve the torque output capacity of the motor to a certain extent. In addition, because the permeability of the permanent magnet is quite different from that of the silicon steel sheet, the auxiliary permanent magnet located on the q-axis magnetic circuit not only acts as an auxiliary magnetic source, but also increases the q-axis reluctance. The design improves the torque output capacity and further improves the negative saliency ratio of the motor, thus ensuring the high torque output of the motor and realizing the superior sensorless operation capability of the motor.

(4) The present disclosure proposes an adaptive secondary harmonic suppression strategy from the perspective of motor drive control to suppress harmonics caused by secondary saliency and improve the observation accuracy of the rotor position. In order to further improve the dynamic response performance of sensorless control, the present disclosure proposes an adaptive band filter based on an all-pass network instead of a fixed-bandwidth filter to extract the rotor position error signal. The proposed control algorithm can give full play to the desired sensorless operation performance of the proposed motor structure under variable operating conditions.

(5) The present disclosure comprehensively improves the sensorless operation accuracy of the motor from the perspective of motor design and control, and provides a new idea for the modern sensorless control theory. The present disclosure can promote the development of the sensorless control theory of the in-wheel motor, and has great engineering application value for the development of electric vehicles.

DETAILED DESCRIPTION OF THE EMBODIMENTS

To make the objectives, technical solutions, and advantages of the present disclosure clearer, the present invention is further described below in detail with reference to the drawings and embodiments. It should be understood that the specific embodiments described herein are merely intended to explain the present disclosure, rather than to limit the present disclosure.

Figure 1:
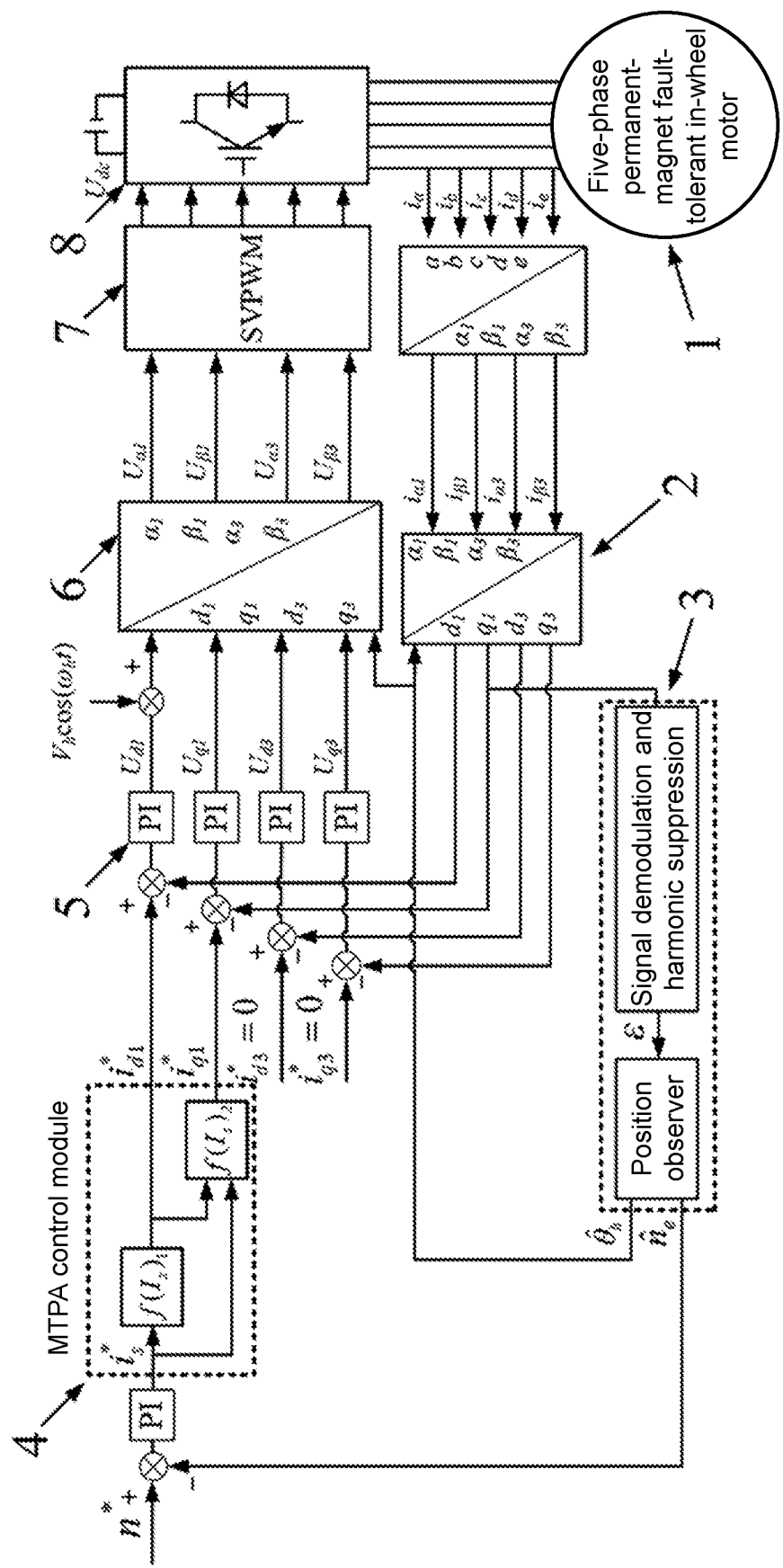
FIG. 1 is a block diagram of a permanent-magnet fault-tolerant in-wheel motor drive system based on an active sensorless strategy according to the present disclosure.

FIG. 1 is a block diagram of a new permanent-magnet fault-tolerant in-wheel motor drive system, with zero- and low-speed operation, based on an active sensorless strategy according to the present disclosure. A five-phase permanent-magnet fault-tolerant in-wheel motor (1) is configured to serve as a system drive motor. A Park transform module (2) and an inverse-Park transform module (6) are configured to decouple a mathematical model in a natural coordinate system. A sensorless control module (3) is configured to estimate a rotor position $\hat{\theta}_e$ and a speed $\hat{n}_e$. A MTPA control module (4) based on an equation method is configured to distribute an optimal quadrature- and direct-axis currents $i_{d1q1}^*$ under a given torque according to quadrature- and direct-axis reference current calculation equations $$i_{d1}^* = \frac{-\psi_f + \sqrt{\psi_f^2 + 8(L_{d1} - L_{q1})^2 i_s^2}}{4(L_{d1} - L_{q1})} \text{ and } i_{q1}^* = \sqrt{i_s^2 - i_{d1}^{*2}},$$

where $\Psi_f$, $i_s$, $L_{d1}$, and $L_{q1}$ denote a permanent-magnet flux linkage, a stator current amplitude, a direct-axis inductance, and a quadrature-axis inductance, respectively. A PI controller (5) is configured to adjust a deviation between given currents and a feedback current to obtain a given voltage signal. A SVPWM module (7) is configured to modulate the voltage signals in a given two-phase static coordinate system into a desired PWM signal. An inverter module (8) is configured to output a five-phase voltage signal to provide power to the five-phase permanent-magnet fault-tolerant in-wheel motor (1).

Figure 2:
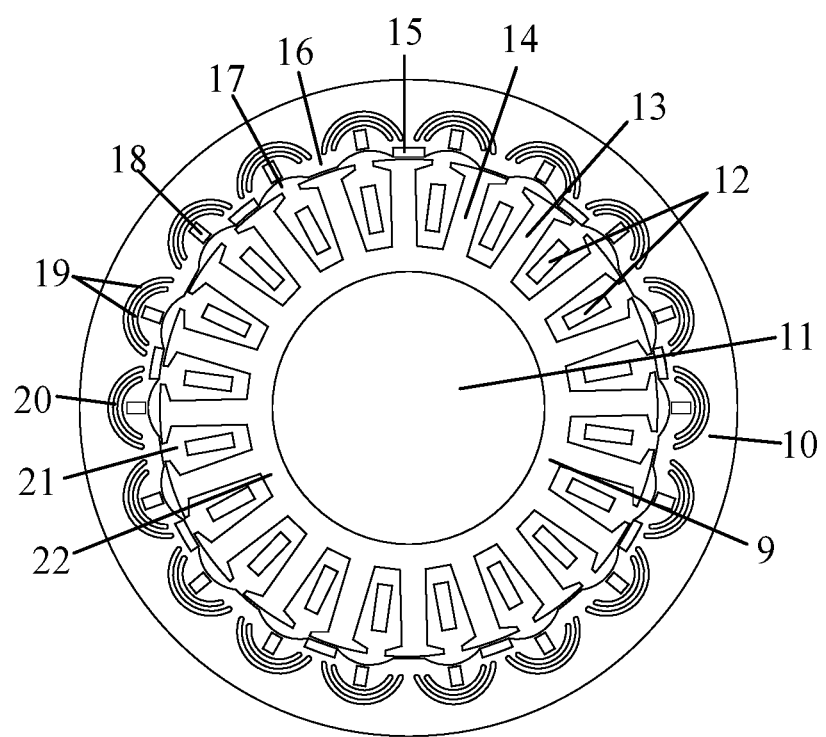
FIG. 2 is a structure diagram of a permanent-magnet fault-tolerant in-wheel motor based on the active sensorless strategy according to the present disclosure.

FIG. 2 is a structure diagram of a permanent-magnet fault-tolerant in-wheel motor based on the active sensorless strategy according to the present disclosure. The motor adopts a slot-pole combination solution of a traditional fault-tolerant motor, and a five-phase motor adopts a combination of 20 slots/18 poles. The permanent-magnet fault-tolerant in-wheel motor based on the active sensorless strategy includes a rotating shaft (11), a stator (9), and a rotor (10) that are arranged in order from inside to outside. The stator (9) is composed of a stator yoke (22), armature teeth (14), stator slots (21), and fault-tolerant teeth (13); the armature teeth (14) and the fault-tolerant teeth (13) are evenly spaced along an outer circumference of the stator (9); the armature teeth (14) are wound with armature windings (12), respectively; each two adjacent armature teeth (14) are isolated by the fault-tolerant tooth (13); main permanent magnets (15) and core poles (16) are evenly spaced along an inner circumference of the rotor (10); the main permanent magnets (15) are surface-embedded arc permanent magnets, and each of surface-embedded main permanent magnet poles forms a pair of magnetic poles with the adjacent core pole (16); a q-axis magnetic barrier (17) close to an air gap side is formed between the surface-embedded main permanent magnet pole and the core pole (16), and the q-axis magnetic barrier (17) forms an uneven air gap with the outer circumference of the stator (9); a multi-layer arc magnetic barrier (19) close to an outer circumference side is formed between the surface-embedded main permanent magnet pole and the core pole (16), and each layer of the multi-layer arc magnetic barrier forms a magnetic bridge (20); a rectangular auxiliary permanent magnet (18) is provided between the q-axis magnetic barrier (17) and the arc magnetic barrier close to the air gap; and the auxiliary permanent magnet (18) is connected in series with the main permanent magnet (15). The stator (9) and the rotor (10) each are formed by laminating a magnetically conductive material such as a silicon steel sheet, with a lamination factor of 0.96; and the armature windings (12) are made of an enameled copper conductor material.

Figure 3:
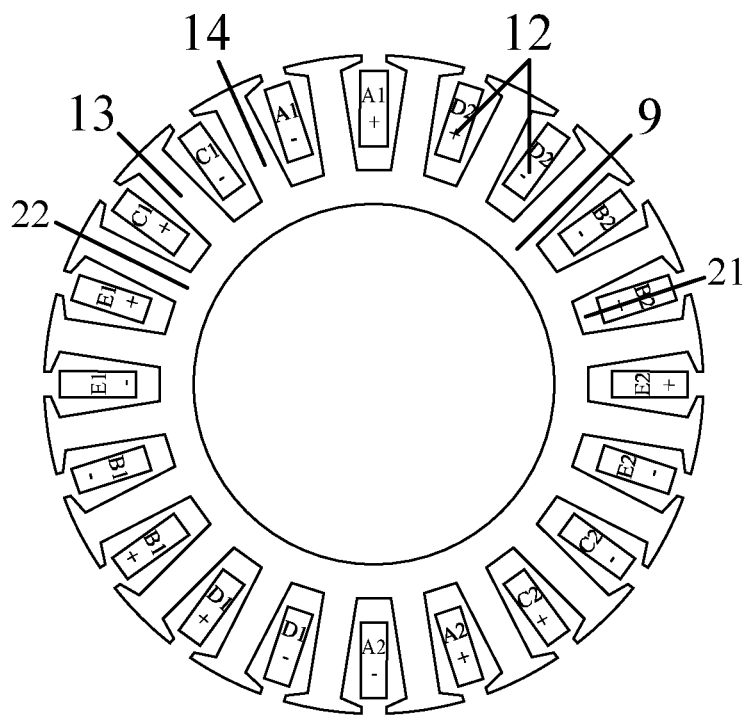
FIG. 3 is a structure diagram of a stator and a distribution diagram of an armature winding, where the stator and the armature winding are shown in FIG. 1.

FIG. 3 is a structure diagram of the stator (9) and a distribution diagram of the armature winding (12), where the stator and the armature winding are shown in FIG. 1. The stator (9) is provided with 20 slots, which are semi-closed flat-bottom slots. The armature windings (12) are wound on the armature teeth (14) and are single-layer concentrated windings. The armature windings (12) are arranged in an order indicated in FIG. 2. "+" indicates an incoming direction of the winding, and "−" indicates an outgoing direction of the winding. The armature windings (12) are isolated by the fault-tolerant teeth (13).

Figure 4:
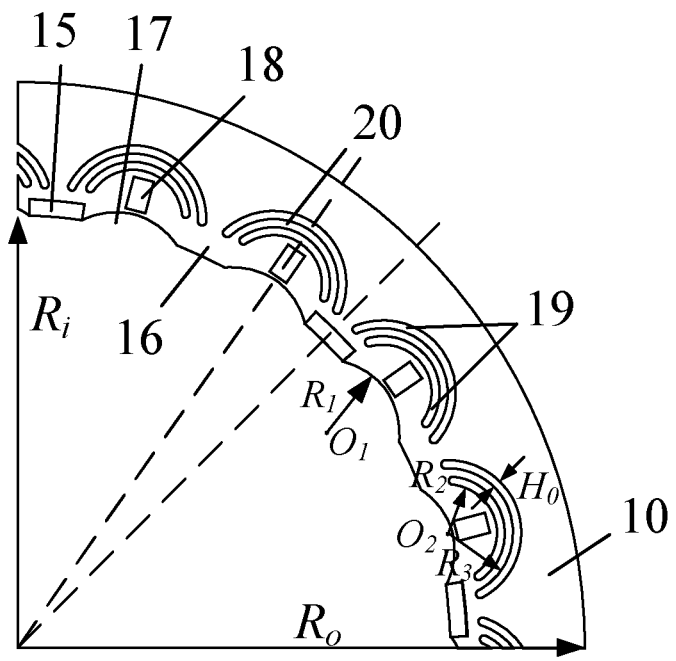
FIG. 4 is an enlarged partial structure diagram, with geometric dimensions, of a rotor shown in FIG. 1.

FIG. 4 is an enlarged partial structure diagram, with geometric dimensions, of the rotor (10) shown in FIG. 1. The rotor (10) has an inner radius of $R_i$ and an outer radius of $R_O$. The surface-embedded arc main permanent magnets (15) are alternately distributed on the inner circumference of the rotor (10). The main permanent magnet (15) and the core pole (16) form a pair of magnetic poles. The q-axis magnetic barrier (17) close to an inner circumference side is formed between the main permanent magnet (15) and the core pole (16), and the q-axis magnetic barrier (17) is centered on a point $O_1$ of a circle and has a radius of $R_1$. The multi-layer arc magnetic barrier (19) close to the outer circumference side is formed between the main permanent magnet (15) and the core pole (16), and the multi-layer arc magnetic barrier is centered on a point $O_2$ of a circle and has radii of $R_2$ and $R_3$. The arc magnetic barrier has a thickness of $H_0$, effectively increasing a q-axis reluctance. The multi-layer arc magnetic barrier (19) forms a magnetic bridge (20), which reduces an influence on a d-axis flux. The rectangular auxiliary permanent magnet (18) close to the air gap is provided between the q-axis magnetic barrier (17) and the arc magnetic barrier. Due to a low permeability of the permanent magnet, the auxiliary permanent magnet acts as the q-axis magnetic barrier (17) while providing an auxiliary magnetic field, to improve a negative saliency effect while increasing the torque.

Figure 5:
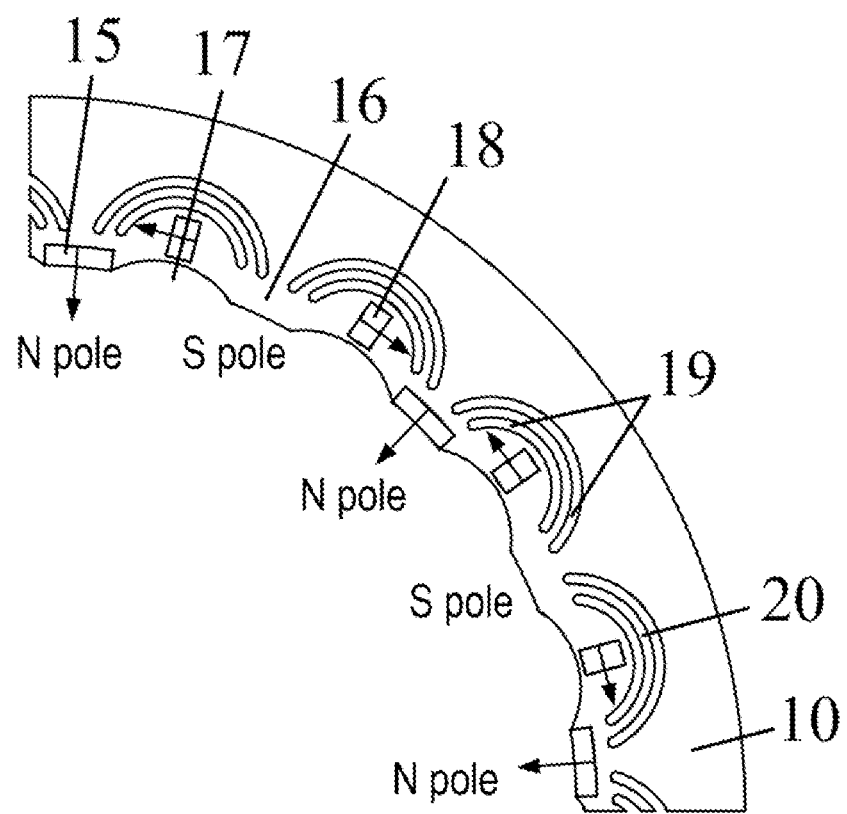
FIG. 5 is a schematic diagram of magnetization of neodymium-iron-boron permanent magnets on the rotor shown in FIG. 1.

FIG. 5 is a schematic diagram of magnetization of the neodymium-iron-boron permanent magnets on the rotor (10) shown in FIG. 3. The magnetizing direction of the alternating surface-embedded main permanent magnets (15) on the inner circumference of the rotor (10) points to the center of the circle, and the main permanent magnet forms a pair of magnetic poles with the core pole (16) nearby. The auxiliary permanent magnets (18) located on both sides of the main permanent magnet (15) are magnetized in a reverse direction along the circumference, forming a magnetic circuit in series with the main permanent magnet (15).

Figure 6:
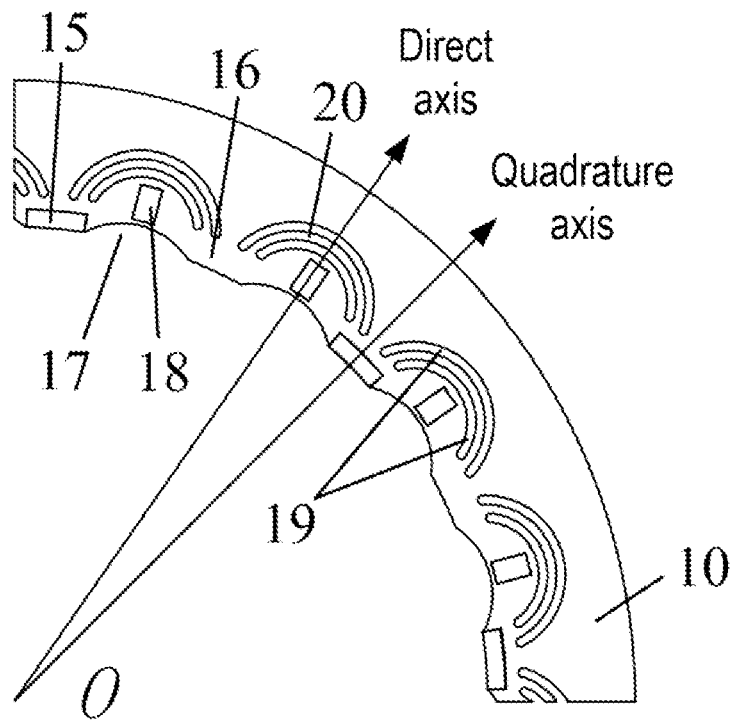
FIG. 6 is a schematic diagram of a direct axis and a quadrature axis of the rotor shown in FIG. 1.

FIG. 6 is a schematic diagram of the direct axis and the quadrature axis of the rotor (10) shown in FIG. 1. A pole centerline of the main permanent magnet (15) is along the direct axis, and a centerline between the main permanent magnet (15) and the core pole (16) is along the quadrature axis. A difference between the direct axis and the quadrature axis is a 90-degree electrical angle. An inductance corresponding to the quadrature axis of the motor is called a quadrature-axis inductance, and an inductance corresponding to the direct axis of the motor is called a direct-axis inductance.

Figure 7:
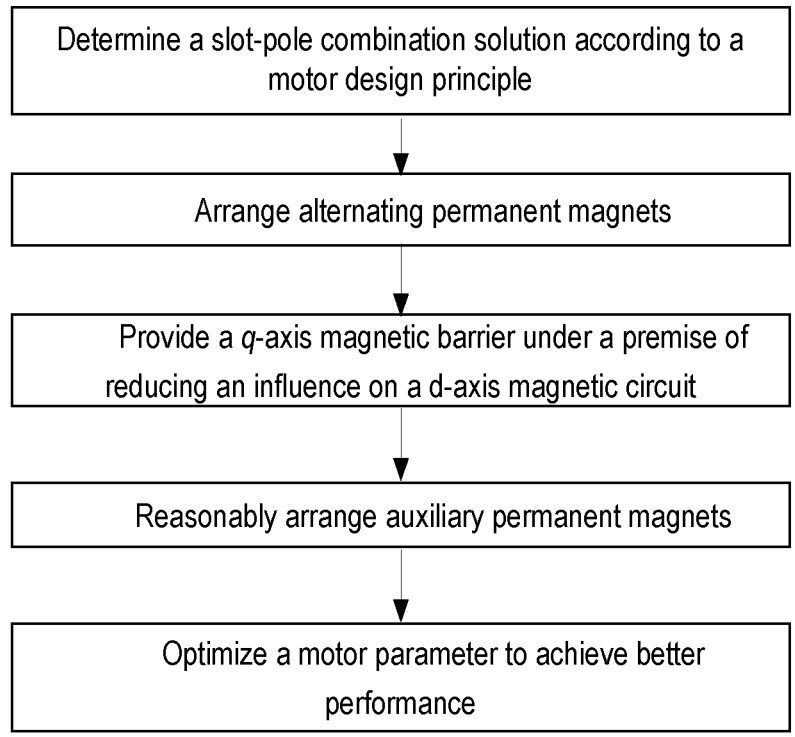
FIG. 7 is a block diagram of a design method of the permanent-magnet fault-tolerant in-wheel motor based on the active sensorless strategy according to the present disclosure.

FIG. 7 is a block diagram of a design method of the permanent-magnet fault-tolerant in-wheel motor based on the active sensorless strategy according to the present disclosure. The design method specifically includes the following steps.

Step 1.1). A number of teeth of the stator (9) and a number of pole pairs of the rotor (10) are initially determined by a slot-pole combination design method of a traditional fault-tolerant motor, and slot vectoring is determined based on a principle of a maximum fundamental resultant vector.

Step 1.2). The alternating surface-embedded main permanent magnet poles are arranged, where the main permanent magnet poles have magnetizing directions pointing to the air gap and form a closed magnetic circuit with the core poles, to improve utilization of the permanent magnets.

Step 1.3). The q-axis magnetic barrier (17) and the multi-layer arc magnetic barrier (19) are provided between the main permanent magnet pole and the core pole (16) to increase a quadrature-axis reluctance, to realize a negative saliency of the motor.

Step 1.4). The rectangular auxiliary permanent magnet (18) with a circumferential magnetizing direction is provided between the q-axis magnetic barrier (17) and the multi-layer arc magnetic barrier (19) to increase the quadrature-axis reluctance while providing an auxiliary magnetic field, to reduce a quadrature-axis inductance and further increase a negative saliency effect of the motor.

Step 1.5). The parameters of the main permanent magnet (15), the auxiliary permanent magnet (18), the q-axis magnetic barrier (17), and the multi-layer arc magnetic barrier (19) are optimized, to obtain a desired negative saliency; and sensorless operation performance is considered in advance in a motor design stage, to complete the design of the permanent-magnet fault-tolerant in-wheel motor with active sensorless operation.

Figure 8:
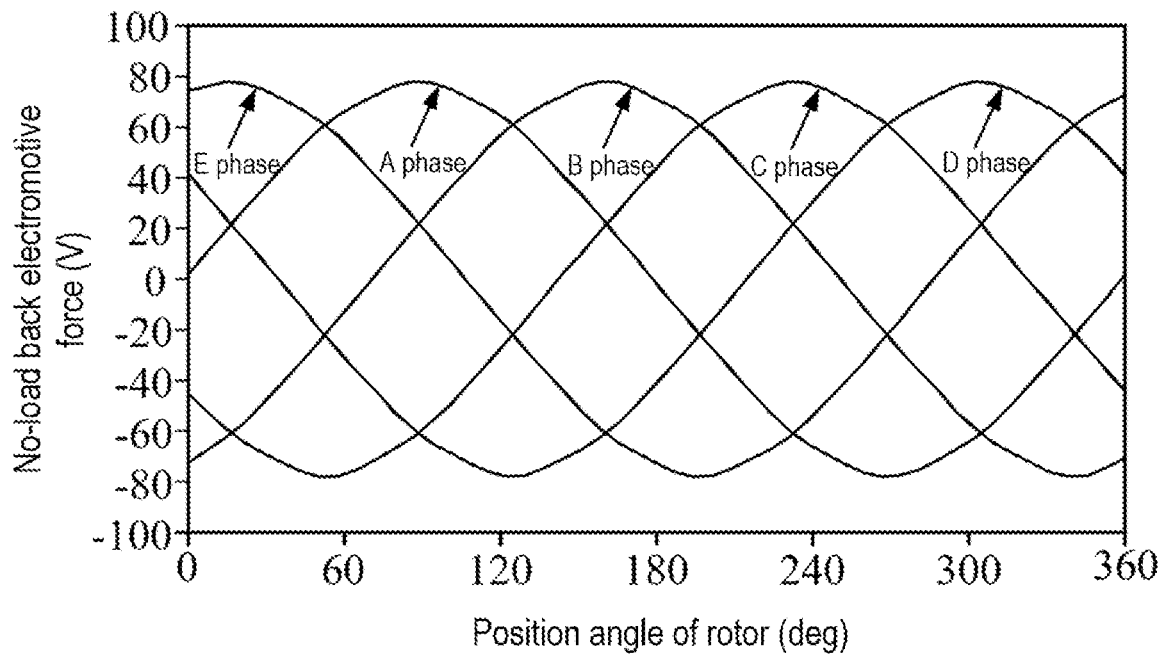
FIG. 8 shows a back electromotive force waveform of the motor according to the present disclosure.

FIG. 8 shows a back electromotive force waveform of the motor according to the present disclosure. A maximum back electromotive force is about 78 V, and a harmonic distortion rate is 2.3%. The back electromotive force of the motor has a desired sinusoidal amplitude, which is easy for the corresponding drive control and can reduce a cogging torque of the motor.

Figure 9:
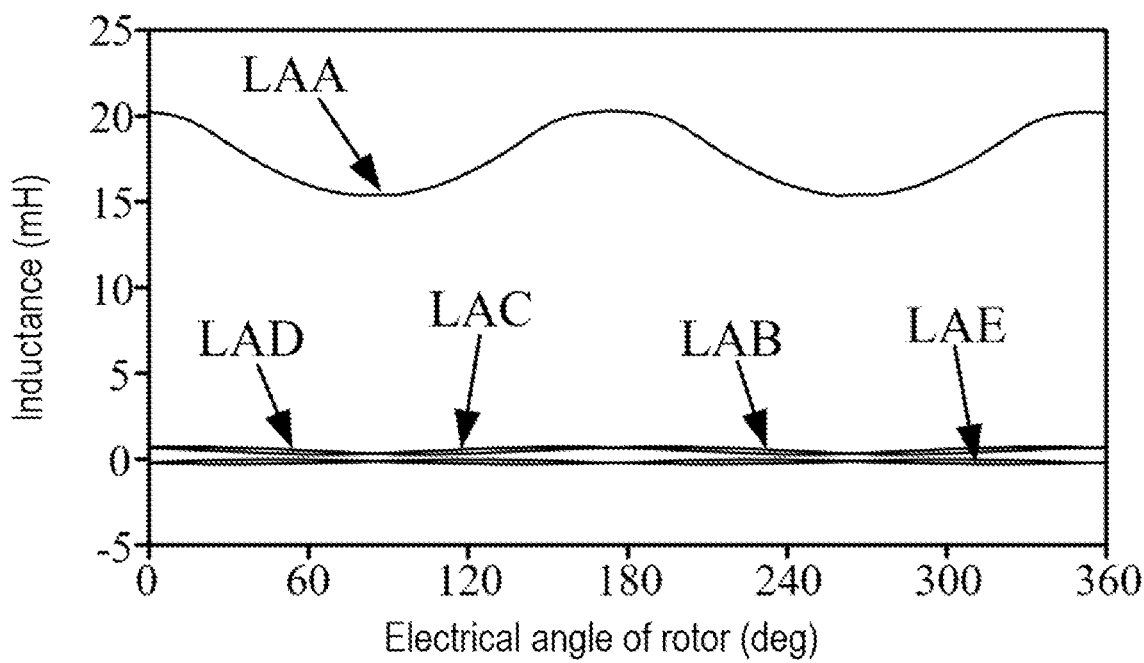
FIG. 9 shows an inductance waveform of the motor according to the present disclosure.

FIG. 9 shows an inductance waveform of the motor according to the present disclosure. The motor has a high self-inductance but a low mutual inductance. The mutual inductance accounts for 2.8% of the self-inductance and has certain short-circuit current suppression capability. The magnetic coupling between phases is small, and magnetic isolation between phases can be realized to improve the fault tolerance of the motor.

Figure 10:
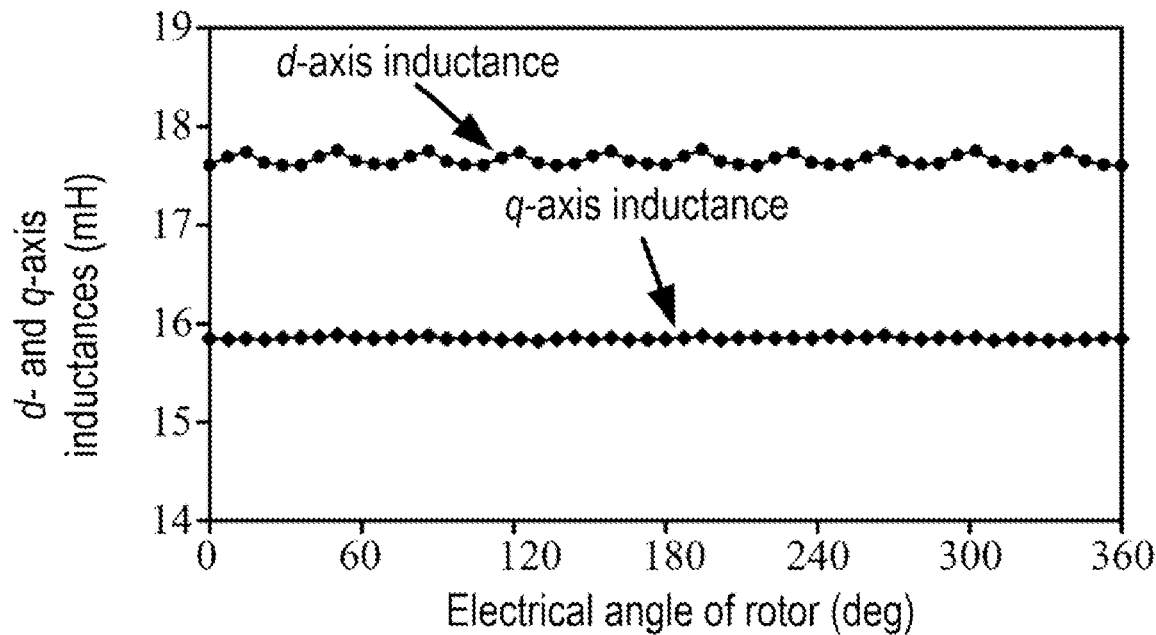
FIG. 10 shows d- and q-axis inductance waveforms of the motor according to the present disclosure under load.

FIG. 10 shows d- and q-axis inductance waveforms of the motor according to the present disclosure under load. The d-axis inductance of the motor is greater than the q-axis inductance. A ratio of the d-axis inductance to the q-axis inductance is about 1.3, which can achieve desired negative saliency. It is easy for the zero- and low-speed sensorless operation of the motor, and can reduce the risk of irreversible demagnetization of the permanent magnet during high-speed flux weakening, to improve the reliability of high-speed cruise.

Figure 11:
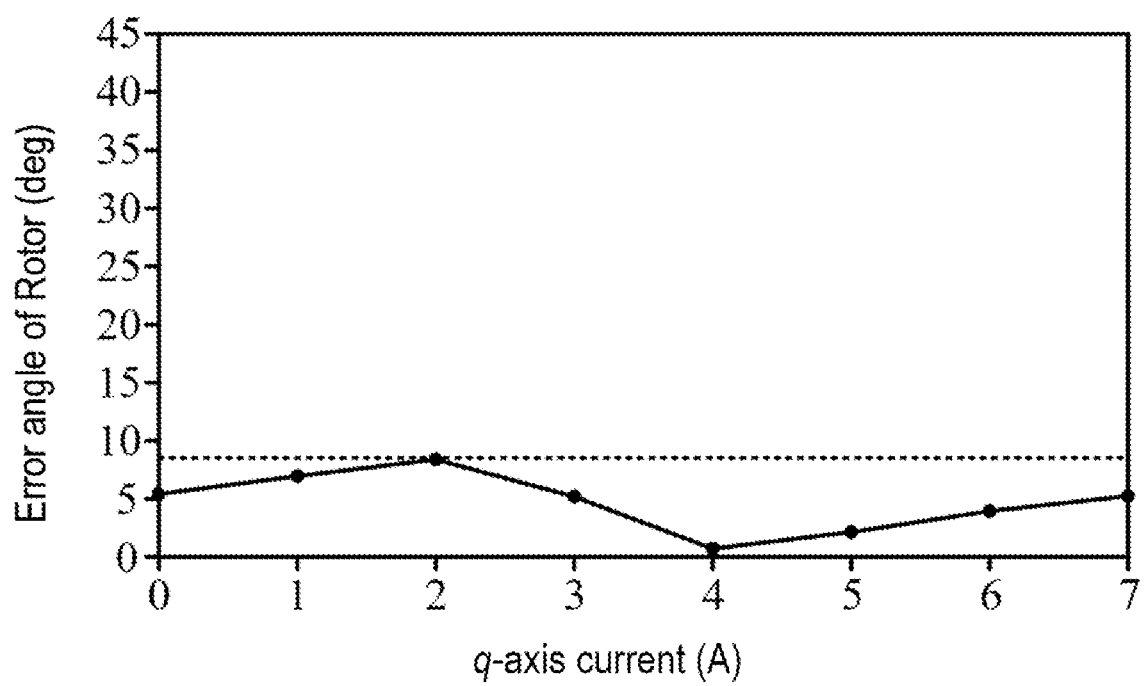
FIG. 11 is a schematic diagram of a rotor position error angle of the motor changing with a q-axis current according to the present disclosure.

FIG. 11 is a schematic diagram of a rotor position error angle of the motor changing with a q-axis current according to the present disclosure. When the q-axis current of the motor changes, the rotor position error angle of the motor changes slightly and has high stability, which can effectively improve the sensorless control accuracy of the motor.

Figure 12:
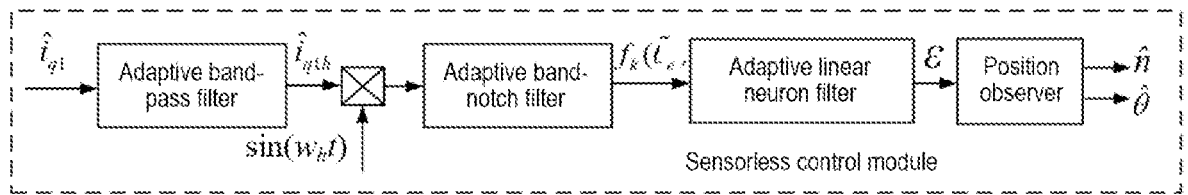
FIG. 12 is a simplified block diagram of a sensorless control module according to the present disclosure.

FIG. 12 is a simplified block diagram of a sensorless control module according to the present disclosure. The frequency-band-adaptive secondary harmonic suppression and position error signal extraction algorithm includes an adaptive band filter and an adaptive linear neuron filter.

Figure 13:
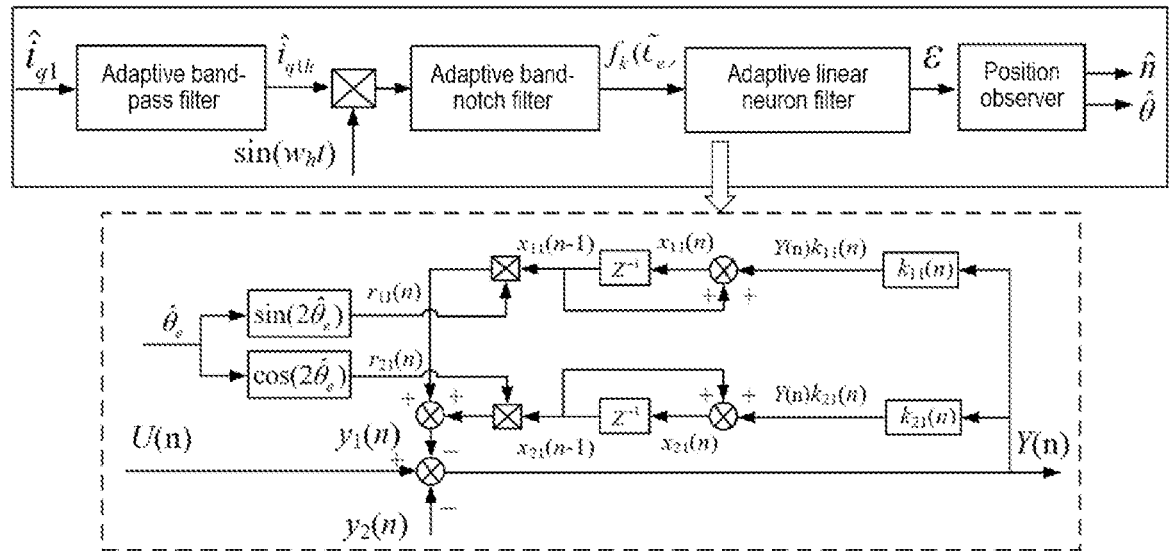
FIG. 13 is a schematic block diagram of an adaptive linear neuron filter according to the present disclosure.

FIG. 13 is a schematic block diagram of the adaptive linear neuron filter according to the present disclosure. A filter coefficient is adjusted through an adaptive algorithm to suppress a specific sub-harmonic in a position error signal. A harmonic reference signal r(n) and an adjustable weight component x(k) are processed to obtain a desired output signal y(n) of the filter. The desired output signal y(n) of the filter is subtracted from an input signal U(n) to obtain a desired fundamental signal Y(n). Calculations by the RLS algorithm are as follows:

$$\begin{cases} y_1(n) = x_{11}(n-1)r_{11}(n) + x_{21}(n-1)r_{21}(n) \\ Y(n) = U(n) - y_1(n) \end{cases}$$

where, $y_1(n)$ denotes a harmonic estimator; $x_{11}(n-1)$ and $x_{21}(n-1)$ each denote an estimated amplitude of a harmonic component; $r_{11}(n)=\sin(2\hat{\theta}_e)$ and $r_{21}(n)=\cos(2\hat{\theta}_e)$ each denote a harmonic reference signal; $\hat{\theta}_e$ denotes an estimated rotor position; Y(n) denotes a filtered output; U(n) denotes a filtered input; and adjustable filter coefficients $x_{11}(n)$ and $x_{21}(n)$ are updated online based on the harmonic reference signal, and are expressed as follows:

$$\begin{cases} x_{11}(n) = x_{11}(n-1) + k_{11}(n)Y(n) \\ x_{21}(n) = x_{21}(n-1) + k_{21}(n)Y(n) \end{cases}$$

where, gain coefficients $k_{11}(n)$ and $k_{21}(n)$ are expressed as follows:

$$\begin{cases} k_{11}(n) = \dfrac{H_{11}(n-1)r_{11}(n)}{\mu + H_{11}(n-1)r_{11}^2(n)} \\ k_{21}(n) = \dfrac{H_{21}(n-1)r_{21}(n)}{\mu + H_{21}(n-1)r_{21}^2(n)} \end{cases}$$

where, $\mu$ denotes a forgetting factor, $0<\mu<1$; An inverse of an autocorrelation matrix $H_1(n)$ is converted into two scales, namely $H_{11}(n)$ and $H_{21}(n)$, to realize a simple and fast implementation of the RLS algorithm; and $H_{11}(n)$ and $H_{21}(n)$ are expressed as follows:

$$\begin{cases} H_{11}(n) = \dfrac{H_{11}(n-1) - k_{11}(n)H_{11}(n-1)r_{11}(n)}{\mu} \\ H_{21}(n) = \dfrac{H_{21}(n-1) - k_{21}(n)H_{21}(n-1)r_{21}(n)}{\mu} \end{cases}.$$

Figure 14:
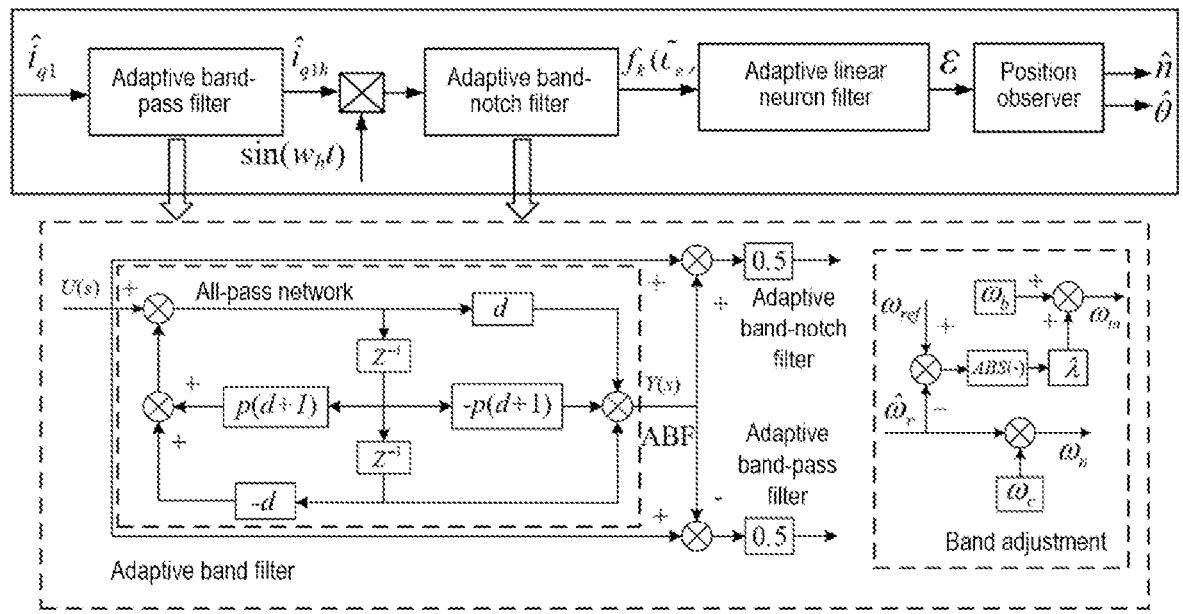
FIG. 14 is a schematic block diagram of adaptive band filtering according to the present disclosure.

FIG. 14 is a schematic block diagram of adaptive band filtering according to the present disclosure. A signal before and after filtering is linearly calculated based on a characteristic that an all-pass network filter only changes a signal phase, and an adaptive band-pass filter and an adaptive band-notch filter are constructed, where a transfer function of a typical second-order all-pass network filter is:

$$A(z) = \frac{d - p(1+d)z^{-1} + z^{-2}}{1 - p(1+d)z^{-1} + dz^{-2}}$$

where, d denotes a correlation coefficient of a filter bandwidth and $$d = \frac{1-\tan(\omega_m T_s/2)}{1+\tan(\omega_m T_s/2)};$$

$\omega_m$ denotes the filter bandwidth with a 3 dB attenuation; $T_s$ denotes a digital sampling period; p denotes a correlation coefficient of a filtering frequency and p=cos ($\omega_n T_s$); $\omega_n$ denotes a resonance frequency point; and a resonance frequency in the adaptive band filter is set as:

$$\omega_n = \omega_c + \hat{\omega}_r$$

where, $\omega_c$ denotes a frequency of an injected high-frequency signal; $\hat{\omega}_r$ denotes an estimated motor speed; the resonance frequency is automatically adjusted with the motor speed to reduce a phase delay caused by the filter; and the filter bandwidth is set as:

$$\omega_m = \omega_b + \lambda |\omega^* - \hat{\omega}_r|$$

where, $\omega_b$ denotes an adjustable bandwidth; $\lambda$ denotes a dynamic adjustment factor; $\omega^*$ denotes a given speed; when the motor runs stably, the dynamic adjustment factor does not work, and the filter bandwidth depends on $\omega_b$; when the motor runs at a variable speed, the dynamic adjustment factor works, and the filter bandwidth is adjusted adaptively according to an error between an actual speed and the given speed to improve the dynamic response performance of the sensorless control; and a modulated current is expressed as:

$$\hat{i}_{q1}^* = \hat{i}_{q1h}^* \sin(\omega_h t) = f_k(\tilde{\theta}_e) + HF(2\omega_h t)$$

where, $\hat{i}_{q1h}$ denotes a $q_1$-axis high-frequency response current; $HF(2\omega_h t) = \hat{I}_{q1h}\cos(2\omega_h t)$; $\omega_h$ denotes an angular frequency of the injected high-frequency signal; $\hat{I}_{q1h}$ denotes an amplitude of a $2^{nd}$-order high-frequency injected harmonic; $f_k(\tilde{\theta}_e)$ denotes a position error function; $\tilde{\theta}_e$ denotes an estimated angular position error; and the modulated current includes the $2^{nd}$-order high-frequency injected harmonic, so $\omega_c$ in the adaptive band-notch filter is set as $2\omega_h$, to obtain the position error signal $f_k(\tilde{\theta}_e)$.

What is claimed is:

1. A permanent-magnet fault-tolerant in-wheel motor based on an active sensorless strategy, comprising a rotating shaft, a stator, and a rotor that are arranged in order from inside to outside, wherein
the stator is composed of a stator yoke, armature teeth, stator slots, and fault-tolerant teeth;
the armature teeth and the fault-tolerant teeth are evenly spaced along an outer circumference of the stator;
the armature teeth are wound with armature windings, respectively;
two adjacent ones of the armature teeth are isolated by one of the fault-tolerant teeth;
main permanent magnets and core poles are evenly spaced along an inner circumference of the rotor;
the main permanent magnets are surface-embedded arc permanent magnets, and each of surface-embedded main permanent magnet poles forms a pair of magnetic poles with adjacent one of the core poles;
a q-axis magnetic barrier close to an air gap side is formed between one of the surface-embedded main permanent magnet poles and one of the core poles, and the q-axis magnetic barrier forms an uneven air gap with the outer circumference of the stator;
a multi-layer arc magnetic barrier close to an outer circumference side is formed between one of the sur-face-embedded main permanent magnet poles and one of the core poles, and a magnetic bridge is formed between layers of the multi-layer arc magnetic barrier;
a rectangular auxiliary permanent magnet is provided between the q-axis magnetic barrier and the arc magnetic barrier close to the air gap; and
the auxiliary permanent magnet is connected in series with one of the main permanent magnets.

2. The permanent-magnet fault-tolerant in-wheel motor based on the active sensorless strategy according to claim 1, wherein
the stator and the rotor each are formed by laminating a magnetically conductive material such as a silicon steel sheet, with a lamination factor of 0.96; and
the armature windings are made of an enameled copper conductor material, and the armature windings are single-layer concentrated windings.

3. The permanent-magnet fault-tolerant in-wheel motor based on the active sensorless strategy according to claim 1, wherein
a number of stator teeth is a multiple of 2m, and a difference between the number of the stator teeth and a number of rotor poles is 2, m denoting a phase number of the motor;
a sum of a number of the permanent magnet poles and a number of the core poles is $P_s$;
the number of the rotor poles is $P_s$, a number of the main permanent magnet poles is $P_s$, a number of auxiliary permanent magnet poles is $P_a$, and the number of the core poles is $P_f$, wherein $P_m + P_f = P_s = P_a$.

4. The permanent-magnet fault-tolerant in-wheel motor based on the active sensorless strategy according to claim 1, wherein
the multi-layer arc magnetic barriers are each located between one of the main permanent magnet poles and one of the core poles and are evenly distributed along a circumference of the rotor;
the auxiliary permanent magnets are each located between one of the arc magnetic barriers and one of the q-axis magnetic barriers and are evenly distributed along an outer circumference of the rotor;
the q-axis magnetic barriers each are centered on a point of $O_1$ and have a radius of $R_1$; and
the multi-layer arc magnetic barriers each are centered on a point of $O_2$, and have radii of $R_2$ and $R_3$ and a thickness of $H_0$.

5. The permanent-magnet fault-tolerant in-wheel motor based on the active sensorless strategy according to claim 1, wherein
the main permanent magnets and the auxiliary permanent magnets are both made of neodymium-iron-boron permanent magnet steel;
magnetizing directions of the main permanent magnets each point to a center of a circle, and magnetizing directions of the auxiliary permanent magnets are each along a circumference of the circle; and
the magnetizing directions of two adjacent ones of the auxiliary permanent magnets are opposite.

6. A drive method of the permanent-magnet fault-tolerant in-wheel motor based on the active sensorless strategy according to claim 1, comprising the following steps:
step 1: designing the permanent-magnet fault-tolerant in-wheel motor based on the active sensorless strategy according to claim 1, wherein sensorless operation performance is comprehensively considered in a design stage, to obtain desired sensorless operation performance and fault tolerance;

step 2: in order to give full play to the superior sensorless operation performance of the permanent-magnet fault-tolerant in-wheel motor in the step 1, proposing a frequency-band-adaptive secondary harmonic suppression and position error signal extraction algorithm, to suppress an influence of a secondary salient harmonic on position observation, and improve dynamic response performance of sensorless control; and step 3: constructing a sensorless drive control system for a five-phase permanent-magnet fault-tolerant in-wheel motor according to the new permanent-magnet fault-tolerant in-wheel motor based on the active sensorless strategy in the step 1 and a sensorless control method in the step 2.

7. The drive method of the permanent-magnet fault-tolerant in-wheel motor based on the active sensorless strategy according to claim 6, wherein the step of proposing the frequency-band-adaptive secondary harmonic suppression and salient harmonic on the position observation specifically comprises:

adjusting, by an adaptive linear neuron filter based on a recursive least squares algorithm, a filter coefficient through the adaptive algorithm to suppress a specific sub-harmonic in a position error signal;

processing a harmonic reference signal r(n) and an adjustable weight component x(k) to obtain a desired output signal y(n) of the filter; and subtracting the desired output signal y(n) of the filter from an input signal U(n) to obtain a desired fundamental signal Y(n), wherein calculations by the recursive least squares algorithm are as follows:

$$\begin{cases} y_1(n) = x_{11}(n-1)r_{11}(n) + x_{21}(n-1)r_{21}(n) \\ Y(n) = U(n) - y_1(n) \end{cases}$$

wherein, $y_1(n)$ denotes a harmonic estimator;
$x_{11}(n-1)$ and $x_{21}(n-1)$ each denote an estimated amplitude of a harmonic component;
$r_{11}(n) = \sin(2\hat{\theta}_e)$ and $r_{21}(n) = \cos(2\hat{\theta}_e)$ each denote a harmonic reference signal;
$\hat{\theta}_e$ denotes an estimated rotor position;
Y(n) denotes a filtered output;
U(n) denotes a filtered input; and
adjustable filter coefficients $x_{11}(n)$ and $x_{21}(n)$ are updated online based on the harmonic reference signal, and are expressed as follows:

$$\begin{cases} x_{11}(n) = x_{11}(n-1) + k_{11}(n)Y(n) \\ x_{21}(n) = x_{21}(n-1) + k_{21}(n)Y(n) \end{cases}$$

wherein, gain coefficients $k_{11}(n)$ and $k_{21}(n)$ are expressed as follows:

$$\begin{cases} k_{11}(n) = \dfrac{H_{11}(n-1)r_{11}(n)}{\mu + H_{11}(n-1)r_{11}^2(n)} \\ k_{21}(n) = \dfrac{H_{21}(n-1)r_{21}(n)}{\mu + H_{21}(n-1)r_{21}^2(n)} \end{cases}$$

wherein, $\mu$ denotes a forgetting factor, $0<\mu<1$;
an inverse of an autocorrelation matrix $H_1(n)$ is converted into two scales, namely $H_{11}(n)$ and $H_{21}(n)$, to realize a simple and fast implementation of the recursive least squares algorithm; and the $H_{11}(n)$ and $H_{21}(n)$ are expressed as follows:

$$\begin{cases} H_{11}(n) = \dfrac{H_{11}(n-1) - k_{11}(n)H_{11}(n-1)r_{11}(n)}{\mu} \\ H_{21}(n) = \dfrac{H_{21}(n-1) - k_{21}(n)H_{21}(n-1)r_{21}(n)}{\mu} \end{cases}.$$

8. The drive method of the permanent-magnet fault-tolerant in-wheel motor based on the active sensorless strategy according to claim 7, further comprising: performing linear operation, based on a characteristic that an all-pass network filter only changes a signal phase, on signals before and after filtering, to construct an adaptive band-pass filter and an adaptive band-notch filter, wherein a transfer function of a typical second-order all-pass network filter is:

$$A(z) = \frac{d - p(1+d)z^{-1} + z^{-2}}{1 - p(1+d)z^{-1} + dz^{-2}}$$

wherein, d denotes a correlation coefficient of a filter bandwidth and $$d = \frac{1 - \tan(\omega_m T_s/2)}{1 + \tan(\omega_m T_s/2)};$$

$\omega_m$ denotes the filter bandwidth with a 3 dB attenuation;
$T_s$ denotes a digital sampling period;
p denotes a correlation coefficient of a filtering frequency and $p = \cos(\omega_n T_s)$;
$\omega_n$ denotes a resonance frequency point; and
a resonance frequency in the adaptive band filter is set as:

$$\omega_n = \omega_c + \hat{\omega}_r$$

wherein, $\omega_c$ denotes a frequency of an injected high-frequency signal;
$\hat{\omega}_r$ denotes an estimated motor speed;
the resonance frequency is automatically adjusted with a motor speed to reduce a phase delay caused by the filter; and
the filter bandwidth is set as:

$$\omega_m = \omega_b + \lambda|\omega^* - \hat{\omega}_r|$$

wherein, $\omega_b$ denotes an adjustable bandwidth;
$\lambda$ denotes a dynamic adjustment factor;
$\omega_*$ denotes a given speed;
when the motor runs stably, the dynamic adjustment factor does not work, and the filter bandwidth depends on $\omega_b$;
when the motor runs at a variable speed, the dynamic adjustment factor works, and the filter bandwidth is adjusted adaptively according to an error between an actual speed and the given speed to improve the dynamic response performance of the sensorless control; and
a modulated current is expressed as:

$$\hat{i}_{q1}^* = \hat{i}_{q1h}^* \sin(\omega_h t) = f_k(\hat{\theta}_e) + HF(2\omega_h t)$$

wherein, $\hat{i}_{q1h}$ denotes a $q_1$-axis high-frequency response current;
$HF(2\omega_h t) = \hat{I}_{q1h} \cos(2\omega_h t)$;
$\omega_h$ denotes an angular frequency of the injected high-frequency signal;

$\hat{I}_{q1h}$ denotes an amplitude of a $2^{nd}$-order high-frequency injected harmonic;

$f_k(\tilde{\theta}_e)$ denotes a position error function;

$\tilde{\theta}_e$ denotes an estimated angular position error; and the modulated current comprises the $2^{nd}$-order high-frequency injected harmonic, so $\omega_c$ in the adaptive band-notch filter is set as $2\omega_h$, to obtain the position error signal $f_k(\tilde{\theta}_e)$.

9. The drive method of the permanent-magnet fault-tolerant in-wheel motor based on the active sensorless strategy according to claim 6, wherein the constructing the sensorless drive control system of the five-phase permanent-magnet fault-tolerant in-wheel motor specifically comprises:

configuring the five-phase permanent-magnet fault-tolerant in-wheel motor as a system drive motor module to output an electromagnetic torque $T_e$ and five-phase currents $i_{abcde}$;

configuring a Park transform module to obtain feedback quadrature- and direct-axis current signals $i_{d1g1d3g3}$ based on the five-phase currents $i_{abcde}$;

configuring a sensorless control module based on the frequency-band-adaptive secondary harmonic suppression and position error signal extraction algorithm to estimate a rotor position $\hat{\theta}_e$ and a speed $\hat{n}_e$ based on the feedback current signal $i_{q1}$;

configuring a maximum torque per ampere (MTPA) control module based on an equation method to optimally distribute a difference between a given speed n and an estimated speed $\hat{n}_e$ through a given torque output by a proportional integral (PI) controller to obtain optimal given quadrature- and direct-axis currents $i_{d1q1}^*$;

configuring the PI controller to adjust a deviation between given currents $i_{d1q1d3q3}^*$ and feedback currents $i_{d1q1d3q3}$ to obtain given quadrature- and direct-axis voltage signals $U_{d1q1d3q3}$;

configuring an inverse-Park transform module to inversely transform the given quadrature- and direct-axis voltage signals $U_{d1q1d3q3}$ to obtain voltage signals $U_{\alpha1\beta1\alpha3\beta3}$ in a static coordinate system;

configuring a space vector pulse width modulation (SVPWM) module to modulate the voltage signals $U_{\alpha1\beta1\alpha3\beta3}$ in a given two-phase static coordinate system into a configuring an inverter module to output a five-phase voltage signal through the ten-channel PWM signal to provide power to the five-phase permanent-magnet fault-tolerant in-wheel motor.

* * * * *